United States Patent
White et al.

(10) Patent No.: US 7,824,495 B1
(45) Date of Patent: Nov. 2, 2010

(54) SYSTEM TO CONTINUOUSLY PRODUCE CARBON FIBER VIA MICROWAVE ASSISTED PLASMA PROCESSING

(75) Inventors: Terry L. White, Knoxville, TN (US); Felix L. Paulauskas, Knoxville, TN (US); Timothy S. Bigelow, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 1162 days.

(21) Appl. No.: 11/270,065

(22) Filed: Nov. 9, 2005

(51) Int. Cl.
*C23C 16/00* (2006.01)
*C23F 1/00* (2006.01)

(52) U.S. Cl. .............. 118/718; 118/723 MW; 156/345.41

(58) Field of Classification Search ........... 118/718, 118/723 MW
See application file for complete search history.

(56) References Cited

U.S. PATENT DOCUMENTS

| | | | |
|---|---|---|---|
| 3,607,062 A | 9/1971 | Sudduth | |
| 3,824,398 A | 7/1974 | Boom | |
| 4,197,282 A | 4/1980 | Bailly-Lacresse | |
| 5,037,464 A | 8/1991 | Oohashi et al. | |
| 6,186,090 B1 * | 2/2001 | Dotter et al. | 118/718 |
| 6,372,192 B1 | 4/2002 | Paulauskas | |
| 6,375,875 B1 | 4/2002 | Paulauskas | |
| 6,514,449 B1 | 2/2003 | Paulauskas | |
| 6,749,827 B2 | 6/2004 | Smalley | |
| 2002/0015802 A1 * | 2/2002 | Ozaki et al. | 427/569 |
| 2003/0026980 A1 | 2/2003 | Takeda | |
| 2003/0051993 A1 | 3/2003 | Ricatto | |
| 2004/0063839 A1 | 4/2004 | Kawate | |
| 2004/0258606 A1 | 12/2004 | Yamamoto | |

OTHER PUBLICATIONS

Cohn and Das, A cost assessment of PAN fiber production technologies: conventional and microwave cases, ORNL report to DOE, Feb. 1999.
Delmonte, Technology of Carbon and Graphite Fiber Composites, 1981, pp. 55-61 and 191-192, Van Nostrand Reinhold, New York.
Peebles, Carbon Fibers—Formation, Structure, and Properties, 1995, pp. 18-24 and 128-135, CRC Press, Boca Raton.
Donnet et al., Carbon Fibers, Third Edition, 1998, pp. 27-31 and 180-189, Marcel Dekker, New York.
Johnson, Carbon Fibers, pp. 329-336 in Structure Formation in Polymeric Fibers, D. R. Salem, Editor, 2001, Hanser, Munich.
Pocius, Adhesion and Adhesives Technology, 1997, pp. 159-163, Hanser, Munich.

* cited by examiner

*Primary Examiner*—Karla Moore
(74) *Attorney, Agent, or Firm*—Scully, Scott, Murphy & Presser, P.C.

(57) ABSTRACT

A system to continuously produce fully carbonized or graphitized carbon fibers using microwave-assisted plasma (MAP) processing comprises an elongated chamber in which a microwave plasma is excited in a selected gas atmosphere. Fiber is drawn continuously through the chamber, entering and exiting through openings designed to minimize in-leakage of air. There is a gradient of microwave power within the chamber with generally higher power near where the fiber exits and lower power near where the fiber enters. Polyacrylonitrile (PAN), pitch, or any other suitable organic/polymeric precursor fibers can be used as a feedstock for the inventive system. Oxidized or partially oxidized PAN or pitch or other polymeric fiber precursors are run continuously through a MAP reactor in an inert, non-oxidizing atmosphere to heat the fibers, drive off the unwanted elements such as oxygen, nitrogen, and hydrogen, and produce carbon or graphite fibers faster than conventionally produced carbon fibers.

14 Claims, 7 Drawing Sheets

SYSTEM TO CONTINUOUSLY PRODUCE CARBON FIBER VIA MICROWAVE ASSISTED PLASMA PROCESSING

STATEMENT REGARDING FEDERALLY SPONSORED RESEARCH

This invention was made with Government support under Contract No. DE-AC05-00OR22725 awarded by the U.S. Department of Energy to UT-Battelle, LLC, and the Government has certain rights in this invention.

BACKGROUND OF THE INVENTION

1. Field of the Invention

The invention pertains to apparatus and methods for making carbon fiber from polymer precursors and more particularly to apparatus and methods for using microwave assisted plasma processing to carbonize or graphitize fibers on a continuous or semi-continuous basis

2. Description of Related Art

The most significant obstacle to the widespread use of high-strength, light-weight, carbon fiber based composites by the consumer industry is the high cost of carbon fibers in comparison to lower-strength but heavier conventional structural materials such as steel. This has limited the application of carbon fibers to reinforcing materials in advanced polymer matrix composites. Currently, around 45,000 tons of carbon fibers are produced annually throughout the world. Although this number may seem substantial, the commercial industry has yet to realize the potential widespread use of carbon fibers because of the high costs associated with their production as compared to other materials. The most significant cost factors include the high cost of carbon precursors (45-50% of production costs), the high cost of equipment and energy consumption (20-25% of production costs), and the cost associated with a limited production rate for a quality product. The carbonization, graphitization, and surface treatment stages represent approximately 13%, 15%, and 2%, respectively, of the overall conventional manufacturing cost.

Carbon and graphite fibers are conventionally produced through the controlled pyrolysis of fibrous organic carbon precursors such as PAN, mesophase pitch (petroleum or coal tar), rayon or other polymeric based precursor in what is generally a lengthy and expensive process. The precursor is spun into fibers, stabilized by oxidation at a relatively low temperature (200 to 300° C.), then carbonized at a very high temperature (1300 to 2500° C.), under tension in a conventional graphite brick-lined furnace. The overall carbon fiber manufacturing process requires several hours to produce high-quality carbon fibers, as shown schematically in FIG. 1. The PAN precursor 1 is fed from spool 2 to pretreatment stage 3, to an air oxidation furnace 4 at atmospheric pressure. The fully oxidized PAN precursor 5 enters the carbonization and graphitization furnaces 6 and 7, respectively, which are pressurized to one atmosphere of nitrogen to preclude any further carbon fiber oxidation. The fully graphitized carbon fiber then enters a surface treatment stage 8 and emerges as a fully graphitized and surface treated carbon fiber 9. Sizing and subsequent drying are applied in stages 10 and 11, respectively. The final carbon fiber product is then wound on spool 12 for delivery to the customer.

Three process stages of carbonization 6, graphitization 7 and surface treatment 8 represent much of the time and cost in the overall carbon fiber manufacturing process. The high temperatures in the carbon fiber manufacturing process cause the initial organic material in the fiber to convert into carbon while the fiber's noncarbon elements are expelled in the form of volatile gases.

Carbon fibers are usually produced in bundles (tows) having 1,000 to 100,000 individual filaments. The average fully- or partially-oxidized carbon fiber precursor filament starts out with a diameter of about 10 μm and shrinks to about 7 μm at the end of carbonization process as unwanted components (effluent) in the filaments containing elements such as oxygen, nitrogen, and hydrogen slowly diffuse to the surface. The carbonization process is time consuming and expensive because of power requirements and furnace maintenance costs. Attempts to speed the carbonization process can produce volatile gases such as carbon monoxide and hydrogen, which can create bubbles or cracks in the filaments depending upon quality of precursor and stabilization recipes. These bubbles are structural flaws that substantially weaken the fibers. Therefore, a need exists for a carbon fibers manufactured at lower cost with acceptable automotive-quality mechanical properties.

In the case of PAN, approximately half of the weight of the tow is lost during the carbonization stage. This weight loss consists of converted gases or effluents. Some of these gaseous components are hazardous, so these gases are usually passed through a conventional scrubbed incinerator. Considerable quantities of greenhouse gases are produced in the incineration process. The required incineration of the effluents of carbon fiber production adds manufacturing costs that must be passed along to the customer. Incinerators must operate within their required permitting range and this represents a regulatory limitation on the quantity of carbon fiber production at a given plant.

Early work at Oak Ridge National Laboratory on carbon fiber manufacturing is covered by a number of patents. Use of plasma processing technology for the production of carbon fiber is disclosed in U.S. Pat. No. 6,372,192. This patent discloses simple batch processing of small samples of fully or partially oxidized PAN precursor wound on an quartz frame to support and tension the precursor during plasma processing. The processing tension on the fiber is generated through the natural fiber shrinkage on the fixture. The study proved that batch plasma processing of carbon fiber is feasible on a laboratory scale. Continued work in this area by Paulauskas et al. was disclosed in U.S. Pat. No. 6,375,875, which describes the development of a diagnostic monitor for carbon fiber processing that measures the dielectric properties of carbon fiber using a non-contacting, resonant microwave cavity. U.S. Pat. No. 6,514,449 describes a process to modify the surface topography of graphite fiber via the combined action of microwave and plasma energy. Well-controlled plasma processing was shown to be able to modify the microscopic features on the surface of graphite fiber, which would enhance the interlocking of the resin matrix to the fibers in a composite.

U.S. Pat. No. 3,607,062 describes an applicator used only to graphitize carbon fiber at radiofrequencies less than 500 MHz. The device requires very high electric fields established in a small gap between two electrodes to heat the carbonized fibers from 2000-3500° C. The electric fields along the carbon fiber axis heat the carbon fiber via the principle of dielectric heating using the radiofrequency energy. The high electric fields were produced using a quarter wavelength reentrant coaxial cavity that was tuned to resonance. The electric fields needed to be high because the dielectric heating scales as the product of the frequency times the imaginary (lossy) part of the dielectric constant times electric field squared. Because the heating frequency is very low compared to 2450 MHz, and because the dielectric losses of the carbon fiber are small at lower frequencies, the electric field needed to be very high to make up for the smaller terms in the dielectric heating equation. Unfortunately, a small gap operating at very high electric fields is very prone to dielectric breakdown in the air gap between the electrodes. This would not be very reliable in a production environment. Another problem with the system of '062 is that carbon fiber quickly becomes highly electrically conductive as it is processed from fully carbonized to fully graphitized. As the carbon fiber begins to heat at the beginning of the gap, it starts to transition from a lossy dielectric to a good electrical conductor. However, the electric fields in the small gap can be easily shorted out because the filament begins to conduct as it is heated and this would limit dielectric heating and would tend to cause high voltage breakdown in the gap. Processing the filament with such a system would be very delicate because the carbon fiber filament needs to exit the high field gap before it can cause breakdown, but if the filament residence time is too short, the filament never is fully processed. The heating process would tend to be self-limiting and not very reliable because of electric field breakdown. In addition, '062 is oriented toward single filaments whereas industrial practice requires a system able to process complete tows consisting of thousands of filaments. The processing length is a very small gap in order to generate the high electric fields needed; whereas a processing length of several meters would be more desirable so the residence time could be much higher for a given line speed and power input.

U.S. Pat. No. 5,037,464 describes a method for manufacturing carbon-coated optical fibers using a microwave-generated plasma. The protective carbon-coating layer is formed via carbon vapor deposition on the optic fibers. This is not a method for manufacturing carbon fibers but merely a way to coat or surface clean an existing optical, not carbon, fiber.

U.S. Pat. No. 4,197,282 describes a method to sequentially batch manufacture only carbon fibers using pitch-based precursors exclusively. The pitch was obtained from residues of the distillation of coal and petroleum. The process is inherently a systematic batch process not suitable for continuous processing applications. No plasma processing is employed in the manufacturing process. Prior to the application of microwave for graphitization, the precursor requires extensive pretreatments, both thermal and chemical, to achieve conditions that are essential for the coupling of the microwave energy to the fiber. This pretreatment is required in order to obtain a high content of carbon in the precursor and because the chemistry between PAN and pitch-based precursors are completely different.

U.S. Pat. No. 6,749,827 describes a method for growing carbon fiber from single-walled nanotubes. The single-wall nanotube is required to act as a seed or substrate for the subsequent formation of the carbon fiber. The carbon comes from a gaseous carbon source produced by a high power laser. The process is primarily a laboratory technique and was not specifically adapted to the continuous manufacture of carbon fiber.

U.S. Pat. No. 3,824,398 describes a method for generating a radio frequency coaxial discharge plasma between an inner electrode on axis and an outer electrode that could be used to treat carbon fiber tows. The patent also describes a method to isolate the pressure in the plasma from the external atmosphere by using an air lock consisting of a pair of small ducts roughly the same diameter as the tow, and spaced close together along the duct that encloses the tow.

US Patent Application No. 2003/0026980 discloses a method to produce hollow carbon tubes and fibers. These fibers are produced in the nano-scale range of sizes. In general, this method is based on a multi-batch process and the carbon fibers and tubes are grown on a micro-seed as a substrate. This method is not suitable for producing carbon fibers on an industrial scale.

US Patent Application No. 2003/0051993 discloses the plasma activation of some types of chemical reactions. It is a plasma-assisted chemical processing method. The applications uses a non-thermal capillary discharge plasma that is, in general, not very uniform over a large processing area. This method limits itself to the application of plasma with chemical feedstocks, such as hydrocarbons, to chemically oxidize or to produce functional chemical groups on the processed material.

OBJECTS AND ADVANTAGES

Objects of the present invention include the following: providing an apparatus for continuously processing carbon fiber; providing an apparatus for subjecting carbon fiber to a microwave plasma; providing an apparatus for transporting a carbon fiber tow through a microwave plasma chamber while controlling the flow of gases into or out of the chamber; providing an apparatus for producing carbon fiber at lower cost and with improved properties; providing an apparatus for producing carbon fiber while reducing the amount of effluent gases that must be scrubbed; providing a method for making fully carbonized or graphitized carbon fibers using microwave assisted plasma processing; providing a method for carbonizing or graphitizing a fiber tow at higher speed and lower cost; and, providing a method for maintaining a selected plasma processing environment while transporting a fiber tow continuously through said environment. These and other objects and advantages of the invention will become apparent from consideration of the following specification, read in conjunction with the drawings.

SUMMARY OF THE INVENTION

According to one aspect of the invention, an apparatus for continuously processing carbon fiber comprises:

a generally elongated chamber adapted to maintain a selected atmosphere, the chamber having a first end with a first opening adapted to allow at least one fiber tow to enter the chamber and a second end with a second opening adapted to allow the fiber tow to exit the chamber, the first and second openings adapted to limit incidental gas flow into or out of said chamber;

a supply of process gas into the chamber; and, a source of microwave power into the chamber, the microwave source configured to provide a microwave power gradient within the chamber in counterflow relationship to the direction of travel of the fiber tow, the power sufficient to support a plasma in the selected atmosphere over at least a portion of the length of the chamber.

According to another aspect of the invention, a method for continuously processing carbon fiber comprises the steps of:

a. establishing a microwave plasma in a selected atmosphere contained in a generally elongated chamber, the chamber having therein a microwave power gradient along its length defined by generally lower microwave power at one end and generally higher microwave power at the opposite end, the chamber further having an opening in each of its ends adapted to allow the passage of a fiber tow while limiting incidental gas flow into or out of the chamber; and, b. introducing a continuous fiber tow into the end of the chamber where the microwave power is lower and withdrawing the fiber tow from the opposite end of the chamber where the microwave power is higher, whereby the fiber tow is subjected to progressively higher microwave energy as it is processed.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting embodiments illustrated in the drawing figures, wherein like numerals (if they occur in more than one view) designate the same elements. The features in the drawings are not necessarily drawn to scale.

DETAILED DESCRIPTION OF THE INVENTION

Figure 1:
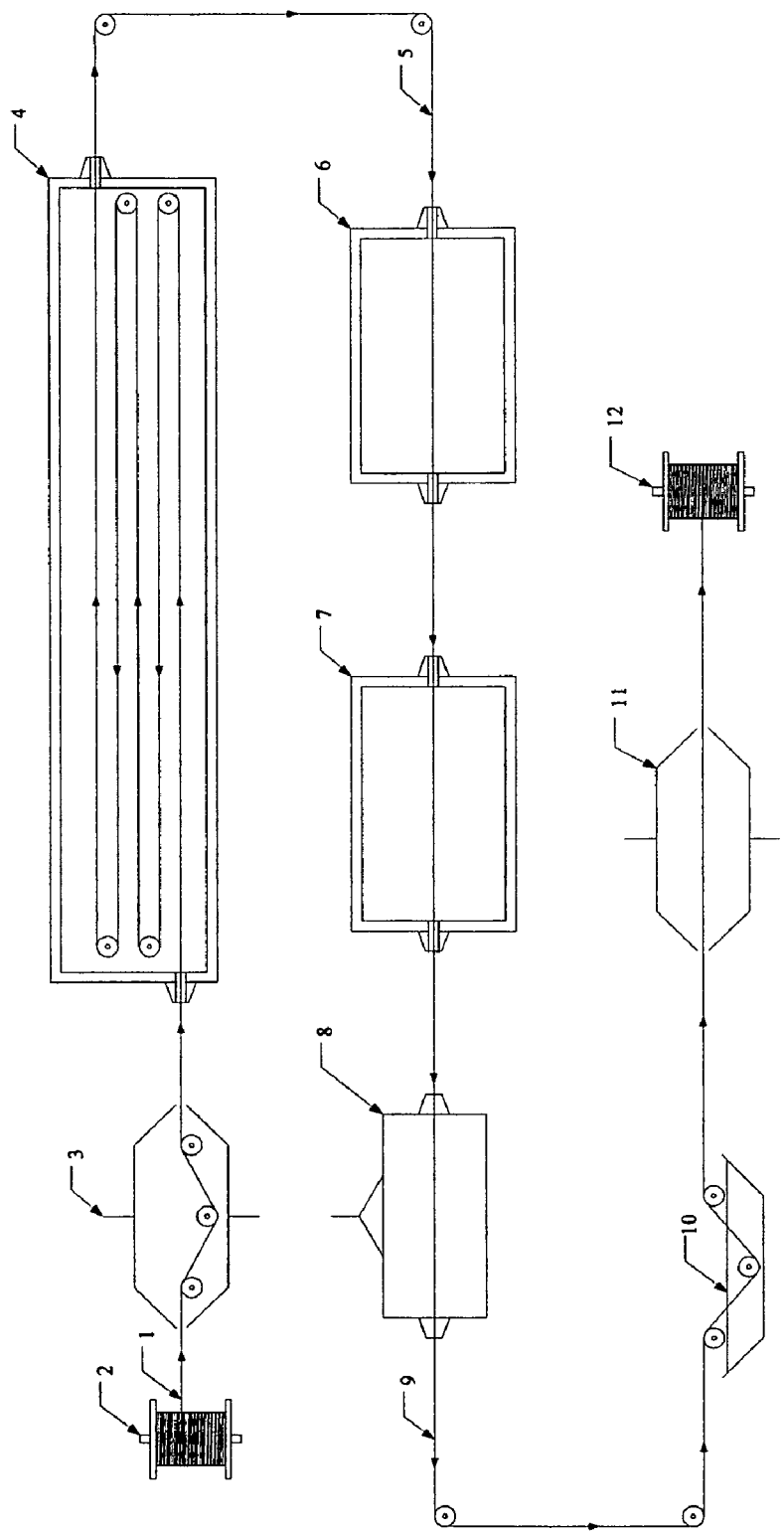
FIG. 1 is a schematic diagram of a conventional process for fiber carbonization.

This invention addresses the manufacturing costs by enabling a new production method to reduce the time needed for carbonization/graphitization, and surface treatment to obtain the desired mechanical properties by the combined use of microwave and plasma energy. Preliminary estimates indicate that the inventive plasma technology may be able to increase the throughput line speed by a factor of two to three. Since the plasma units are smaller and several units can replace the massive single ovens currently used, maintenance, down time, capital equipment costs, and plant space requirements may be greatly reduced. This plasma can be generated and sustained by many different ways, one of them, for example, could be microwave energy and/or another type of electric energy such as radio frequency energy or even laser-produced plasma discharges.

Because the microwave assisted plasma (MAP) system has a low thermal inertia (low mass), the time required to heat up and or cool down the MAP system is less than the time required to heat or cool conventional carbon fiber carbonization/graphitization systems. Startup operations in conventional ovens require several hours to thermally stabilize the processing line before production can commence. This startup wastes a significant amount of precursor feedstock that is not fully processed until the ovens stabilize. The inventive MAP system thermally stabilizes in only minutes due to the low mass of the MAP system, so that if other parts of the process could also be sped up, the amount of wasted startup precursor could be significantly reduced. Finally, the low thermal inertia of the MAP processing system allows for rapid changes in the amount of processing in the carbonization and graphitization stages, so that carbon fiber properties can be rapidly changed to suit customer needs during production.

The examples discussed below are primarily focused on the use of PAN as the initial thermoplastic precursor material. It will be appreciated that the inventive system may also be used with many other precursor materials including, for example: 1. Rayon fibers or cellulose fibers, lignin, and lignin-base/blended precursors; 2. Polyalkenes and polyolefins through PVC, including exotic rigid rod polymers; 3. Polyethylene, polypropylene, polybutadiene; 4. Polyesters such as polyethylene terephthalates (PET); 5. PBT or polybutylene terephthalates; 6. Petroleum or coal tar (pitch); 7. Low-cost thermoplastic-based polymeric precursors such as commodity grade (carpet-grade and chemically-modified carpet-grade) PAN and other chemically modified or pretreated thermoplastic precursors; and, 8. Chemically modified or chemically compounded precursors.

These precursors will typically require an oxidative stabilization pretreatment to be useful as a MAP feedstock. The degree of stabilization pretreatment depends upon the specific precursor selected.

The system to continuously produce carbon fiber via microwave-assisted-plasma (MAP) processing produces carbon fiber faster with lower total energy consumption compared to conventional processing. Fully or partially oxidized PAN is strongly heated by microwave energy since the amorphous carbon in this material is a good microwave absorber compared to the metal waveguide and microwave-transparent reactor. The microwave energy heats the entire filament cross-section uniformly and rapidly because the filament diameter is much smaller than the microwave absorption length in the filament. Diffusion rates of the carbon fiber effluents in the microwave-heated filaments will therefore generally be higher than conventional heated filaments at the same surface temperature. This is contrary to the conventional heating process where filaments are surface heated by an external heat source such as a gas or electrically heated oven, and the heat has to diffuse to the interior of the tow filaments.

Figure 2:
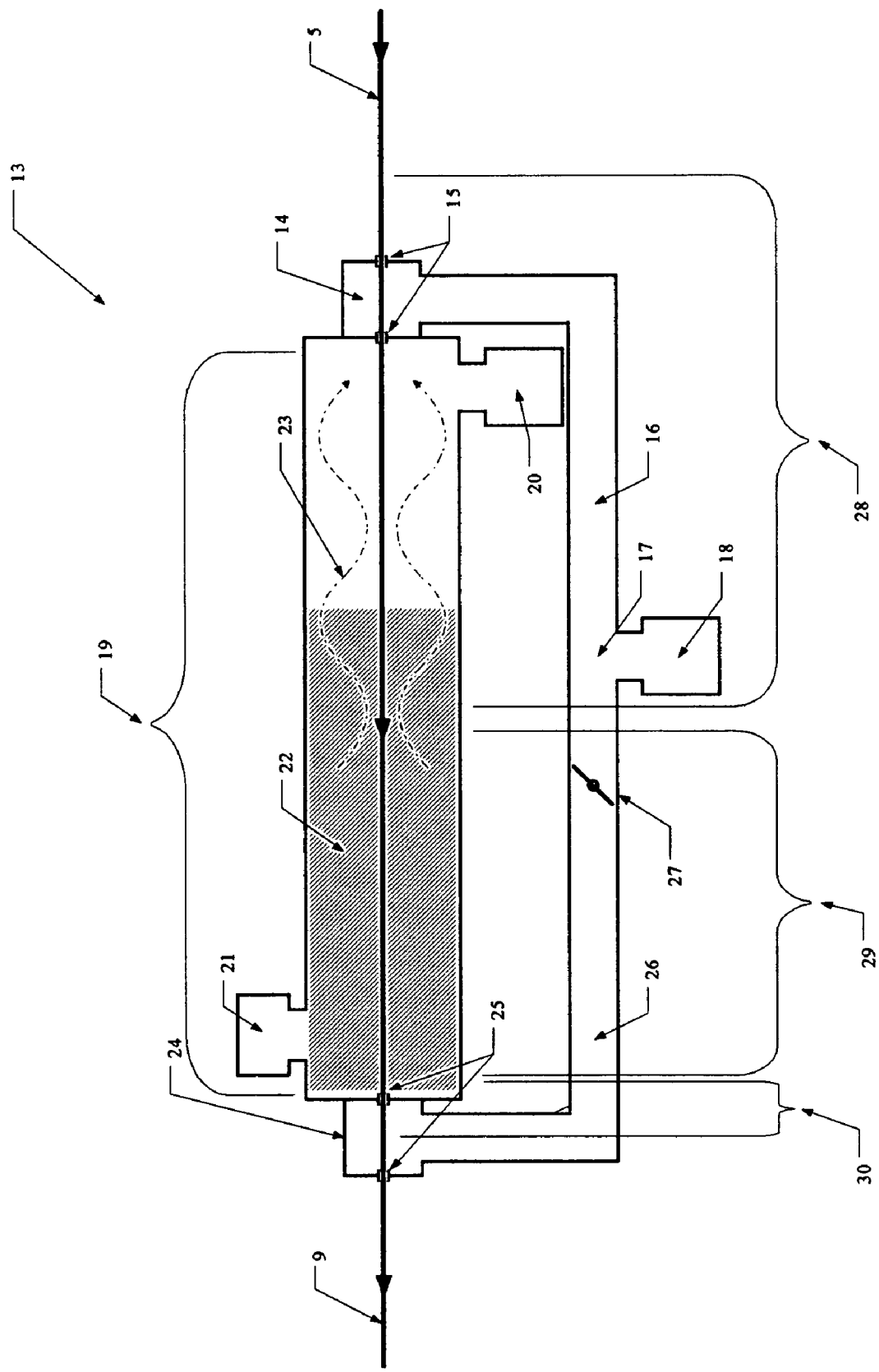
FIG. 2 is a schematic diagram of one embodiment of the present invention.

The MAP process, indicated generally at 13 in FIG. 2, is intended to replace several furnace components in the conventional process (indicated at 6, 7, and 8 in FIG. 1). A single tow is shown for clarity, but it will be understood that multiple tows in parallel can be processed in the same system, provided that the cross sectional area of the MAP system is sufficiently large. The fully or partially-oxidized fiber tow 5, in air at one atmosphere (760 Torr) of pressure, enters and exits the MAP input differential pumping chamber 14 through a pair of small ducts 15 whose vacuum conductance is much less than that of large duct 16 connected to high speed vacuum pump 18 through pumping tee 17. The conductances of the ducts 15 and 16 may be adjusted to maintain a pressure in chamber 14 of only a few tenths of a Torr in steady state. The tow enters the input of MAP reactor 19, which is evacuated by pump 20 and contains a selected non-oxidizing gas. Reactor 19 may be maintained at any selected pressure that will support a plasma in the selected gas. For example, if the gas is nitrogen, the pressure in reactor 19 will preferably be less than atmospheric and more preferably from about 1-50 Torr. Microwave energy is introduced near the output end of reactor 19 by microwave generator and waveguide system 21. Microwave energy ionizes the gas in reactor 19 and the energy forms a glow-discharge plasma 22 (indicated generally by the cross-hatched area) near the output of reactor 19 that is sufficiently dense to shield tow 5 from direct microwave heating in plasma 22. The microwave power distribution along reactor 19 is adjusted to reduce the plasma density toward the input of reactor 19 so that the corresponding plasma-produced microwave shielding is greatly reduced toward the reactor input to allow for direct microwave heating 23 of tow 5 near the input of reactor 19. The tow exits reactor 19 through an output differential pumping chamber 24 and pair of small ducts 25 similar to small ducts 15. Chamber 24 is connected by duct 26, similar to duct 16, through valve 27 to high speed pump 18 through pumping tee 17. This allows pump 17 to evacuate both input and output differential-pumping chambers 14 and 24, respectively, while being able to increase the amount of air infiltration through small ducts 25 by partially dosing adjusting valve 27. This allows small amounts oxygen to infiltrate through ducts 25 to produce small amounts of oxygen-containing ions and oxygen-containing excited neutral atoms and molecules in plasma 22 that are useful to for attaching oxygen functional groups to the tow surface as a means of in situ tow surface treatment.

In operation, as the partially or fully-oxidized tow 5 enters the MAP reactor 18, it is heated by microwave energy 23 and streaming excited non-oxidizing species produced in plasma 22 to carbonize the tow in carbonization region 28. As the carbonized tow 5 is further heated by plasma 22 the tow is graphitized over graphitization region 29. Near the end of reactor 19, the graphitized tow may be surface treated in surface treatment region 30. The tow exits the MAP process 13 as a partially or fully-graphitized carbon fiber with surface treatment 9. The MAP process works well using nitrogen as the non-oxidizing gas to process the carbon fiber tows, although any other suitable non-oxidizing gas such as hydrogen, helium, neon, or argon gas can be used, provided that these gases do not have undesirable effects on the particular precursor fiber selected or on the quality of the carbon fiber produced. Likewise, through routine experimentation any combination of these non-oxidizing gases may be used to tailor the plasma process to achieve the desired carbon fiber properties.

The MAP reactor 19 is contained within a metal enclosure to contain the microwave energy 21. The low-pressure plasma 22 must be confined and isolated from the microwave energy 21 by a microwave-transparent vacuum chamber. The materials of construction of the vacuum chamber must be compatible with high temperatures and at the same time must have low microwave absorption (low loss) at these temperatures so that the microwave energy can penetrate the vacuum chamber wall and preferentially heat the plasma 22 and tow 5. Quartz and alumina ceramics are examples of high-temperature, low-loss vacuum vessel candidate materials. The tows are initially exposed to ever increasing microwave/plasma power fluxes in a counter-flow arrangement. The fully or partially oxidized PAN precursor tows enter the input microwave reactor section of the MAP system with an electrical resistivity of about $10^{10}$ ohm-cm and exit the MAP system with and electrical resistivity of about $10^{-3}$ ohm-cm. The processed tow undergoes a dramatic change of about thirteen orders of magnitude in the DC electrical resistivity, changing from a good electrical insulator all the way to a good electrical conductor. In the microwave range of frequencies, the microwave absorption starts high for the fully oxidized PAN and increases dramatically around 500° C., and further processing causes the carbon fiber to exhibit the microwave loss characteristics of a lossy electrical conductor. Still further processing increases the electrical conductivity to the point where the carbon fiber shields out the microwave electric fields due to its high conductivity. Using the electrical resistivity (or conductivity) measurement during processing, as a benchmark for the degree of carbon fiber processing, would be very difficult because of the very large and rapid changes in resistivity (or conductivity) in such a short distance and time.

Further experimentation has shown that pure microwave heating of a fully or partially oxidized PAN tow is highly nonlinear and unstable at temperatures exceeding 400 to 500° C. This is because the microwave absorption of oxidized PAN increases exponentially with temperature, which in turn causes the microwave heating to increase, and this condition leads to rapid thermal runaway in the tow. Applicants have discovered, however, that if a 1-20 Torr non-oxidizing glow-discharge plasma is generated around the tow by the same microwaves, and downstream from the initial microwave pre-heating, the plasma will serve to "buffer" or partially shield the tow from the majority of the direct microwave heating, thus avoiding the thermal runaway problem associated with pure microwave heating alone. This is because highly ionized plasmas are known to have high electrical conductivities, because of their highly mobile free electron population that can partially or completely shield out external electromagnetic fields, depending upon the plasma electron density and temperature. At the same time, most of the microwave energy is transferred to the plasma electrons, which create plasma species such as ions, neutral atoms, and neutral compounds. These species are highly reactive because they are excited by a hot electron population (greater than 10,000° C. in temperature).

This flux of reactive species bombards the surfaces of the filaments through the plasma sheath region, and this flux can chemically react with the surface and the interior of the filaments in complicated ways. The net result is that the energy in this flux is transferred to the unwanted compounds in the tow filaments and these compounds are desorbed into the plasma at very high rates compared to thermal processing rates in conventional furnaces. These reactions are highly non-equilibrium in nature and can exceed thermal equilibrium rates by orders of magnitude. This plasma flux will enhance the outward diffusion and desorption of unwanted products of chemical reactions in the filaments containing elements such as oxygen, nitrogen, and hydrogen. These volatile elements and compounds will be rapidly desorbed from the filament and then be ionized by the plasma to ultimately recombine into gases that are pumped away. This process occurs more rapidly compared to conventional processing because the flux contains highly reactive non-thermal free radicals.

Applicants postulate that the carbon fiber precursor is processed by a variety of different and complex mechanisms. First, most of the microwave energy couples directly to the plasma, which in turn produces a flux of electrons, ions, neutral free radicals, and vacuum ultraviolet radiation impinging on the surface of the tow filaments. The combined fluxes enhance surface desorption because the energies of these fluxes are many orders of magnitude higher than the ordinary thermal fluxes used in conventional processing. These high-energy fluxes are known to be capable of breaking chemical bonds of complex organic molecules present in the filaments, which leads to enhanced desorption of tow gasses. Second, the remainder of the microwave energy not coupled to the plasma is absorbed directly by the carbon filaments, since carbon is an ideal microwave absorber. The microwave energy is absorbed uniformly over the bulk of the tow cross-section because the "skin depth" at microwave frequencies is much larger than the tow diameter. This energy goes into simple bulk heating of the filaments. In contrast, the plasma and ultraviolet flux preferentially processes only the filament surface, which is not shadowed by other filaments. Therefore, Applicants' technique is a combined microwave and plasma assisted carbonization/graphitization of the tow filaments where microwave energy heats the bulk of the fiber filaments while the plasma produces a surface flux that enhances the desorption of unwanted compounds from the filament surface. The desorbed unwanted compounds are released in the form of off-gases and removed by a high-speed pumping system at the end of the system.

Compared to U.S. Pat. No. 3,824,398, for example, Applicants' method of isolating the plasma vacuum from atmosphere uses small tapered eyelets that enclose the tow, but has pumping ducts that are much larger in order to maximize the pumping speed and therefore increase the isolation of the plasma vacuum from atmosphere. In addition, Applicants' pumping ducts are spaced much farther apart, measured in tow diameters, compared to '398. Therefore, Applicants' scheme for vacuum isolation is unique and superior to that of '398 because it has larger pumping ducts and the ducts are spaced father apart than those of '398. An alternate method for isolating the plasma vacuum from atmosphere in the present invention uses rollers instead of eyelets to produce flat tows, which are more compatible with standard industry methods of transporting carbon fiber. The inventive plasma reactor may be further isolated from atmospheric oxygen by providing a blanketing flow of nitrogen adjacent to the eyelets or rollers Another advantage of the inventive MAP system is that the generated effluent is partially utilized to process the tow in the plasma section of the reactor. These gases mix with the background gas and are quickly dissociated by the plasma electrons into free radicals, ions, and atoms; these species bombard the tow and become part of the plasma-processing environment. Thus, the tows are processed in their own effluent. In the conventional thermal processing the effluent is rapidly removed to an incinerator to destroy toxic gases and compounds. In the MAP system the toxic gases are dissociated in the plasma, and when they combine downstream they form different chemical compounds. Because of this dissociation, the MAP system potentially reduces the toxic gases such as HCN that are normally generated by conventional carbon fiber carbonization processing. Therefore, the MAP system has the capability to reduce or even eliminate the amount of toxic gases normally produced and thus could reduce or eliminate the need for a conventional incinerator.

EXAMPLE

The inventive process was first demonstrated with a single tow and used a small 50-mm diameter microwave transparent tube approximately 4 m long to contain the tow and plasma. Microwave energy at 915 MHz was introduced at the output end of the system and directed in the opposite direction of the tow travel in a counter-flow arrangement. The system used a pair of rollers to flatten the tow prior to entering and exiting the plasma region. This system produced a short concentrated plasma discharge (about 60 mm long) at the output end. Nevertheless, the initial tow properties were acceptable at low line speeds around (2-5 in/min). This system demonstrated proof-of-principal for a continuous MAP system.

The prototype system produced acceptable quality carbon fibers at low speeds; however the mechanical properties could not be sustained at higher line speeds. The system was therefore modified to achieve better mechanical properties for the carbon fiber line at higher speeds. This was achieved by better microwave power distribution, which increased the plasma length. In the following examples, tow electrical resistance was measured by the four-point method.

Example

To eliminate the extreme concentration of microwave power near the waveguide, a copper tube was placed around the quartz chamber for a short distance at its end nearest the waveguide. About 15-20 KW of power at 915 MHz was applied to excite a plasma in nitrogen at about 5-40 Torr. Fiber tows were processed at line speeds of 7.5, 34.6, 60, and 80 in/min. Table 1 compares the properties of these four samples made by the inventive process and two commercial samples [Com'l$^a$=Zoltek Panex 33 and Com'l$^b$=Fortafil F3(C)]. In Table 1 the improvement can be seen between the line speeds of 60 and 80 in/min.

TABLE 1

Low speed MAP treatment of PAN fibers, single 50K tow

|  | MAP | MAP | MAP | MAP | Com'l$^a$ | Com'l$^b$ |
|---|---|---|---|---|---|---|
| Microwave power (kW) | 20 | 17.4 | 16.9 | 16.5 |  |  |
| Pressure (Torr) | 35 | 9 | 5.5 | 8.5 |  |  |
| Temperature (° C.) | 1186 | 1033 | 1100 | 1200 |  |  |
| Production line speed (in/min) | 7.5 | 34.6 | 60 | 80 |  |  |
| Modulus ($10^6$ lb/in$^2$) | 31.7 | 29.0 | 26.6 | 26.0 | 26.1 | 31.1 |
| Ultimate strength ($10^3$ lb/in$^2$) | 424 | 342 | 248 | 262 | 407 | 485 |
| Elongation at fracture (%) | 1.30 | 1.25 | 0.97 | 1.00 | 1.5 | 1.5 |
| Density (g/cm$^3$) | 1.83 | 1.77 | 1.77 | 1.83 | 1.81 | 1.77 |
| Calculated tow area ($10^{-2}$ cm$^2$) | 1.90 | 2.04 | 2.13 | 2.17 | 1.96 | 2.17 |
| Calculated filament diameter (μm) | 6.97 | 7.20 | 7.36 | 7.44 | 7.37 | 7.43 |
| Tow electrical resistance ($10^{-2}$ Ω/cm) | 8.37 | 8.90 | 14.6 | 14.9 | 8.23 | 7.80 |
| Tow electrical resistivity ($10^{-3}$ Ω-cm) | 1.57 | 1.82 | 3.11 | 3.2 | 1.62 | 1.67 |

Further improvements in line speed were achieved using microwave or rf glow discharge plasmas as preheating sections and the results are described in the following example.

Example

A series of experiments were run at higher line speeds. Table 2 compares the properties of four samples made by the inventive process and two commercial samples [Com'l[a]=Zoltek Panex 33 and Com'l[b]=Fortafil F3(C)].

TABLE 2

High speed MAP treatment of PAN fibers, single 50K tow

|  | MAP | MAP | MAP | MAP | Com'l[a] | Com'l[b] |
|---|---|---|---|---|---|---|
| Net microwave power (kW) | 22 | 29 | 30 | 31 |  |  |
| Outlet pressure (Torr) | 4 | 6 | 6.5 | 7 |  |  |
| Outlet temperature (° C). | 1060 | 997 | 1010 | 1045 |  |  |
| Production line speed (in/min) | 130 | 160 | 180 | 200 |  |  |
| Modulus ($10^6$ lb/in$^2$) | 25.6 | 25.4 | 25.9 | 19.0 | 26.1 | 311 |
| Ultimate strength ($10^3$ lb/in$^2$) | 240 | 272 | 248 | 215 | 407 | 485 |
| Elongation at fracture (%) | 0.94 | 1.07 | 1.00 | 0.92 | 1.5 | 1.5 |
| Density (g/cm$^3$) | 1.80 | 1.82 | 1.79 | 1.79 | 1.81 | 1.77 |
| Calculated tow area ($10^{-2}$ cm$^2$) | 2.32 | 2.35 | 2.38 | 2.39 | 1.96 | 2.17 |
| Calculated filament diameter (μm) | 7.57 | 7.62 | 7.68 | 7.73 | 7.37 | 7.43 |
| Tow electrical resistance ($10^{-2}$ Ω/cm) | 13.5 | 13.8 | 21.4 | 21.8 | 8.23 | 7.80 |
| Tow electrical resistivity ($10^3$ Ω-cm) | 3.12 | 3.23 | 5.10 | 5.22 | 1.62 | 1.67 |

Figure 3:
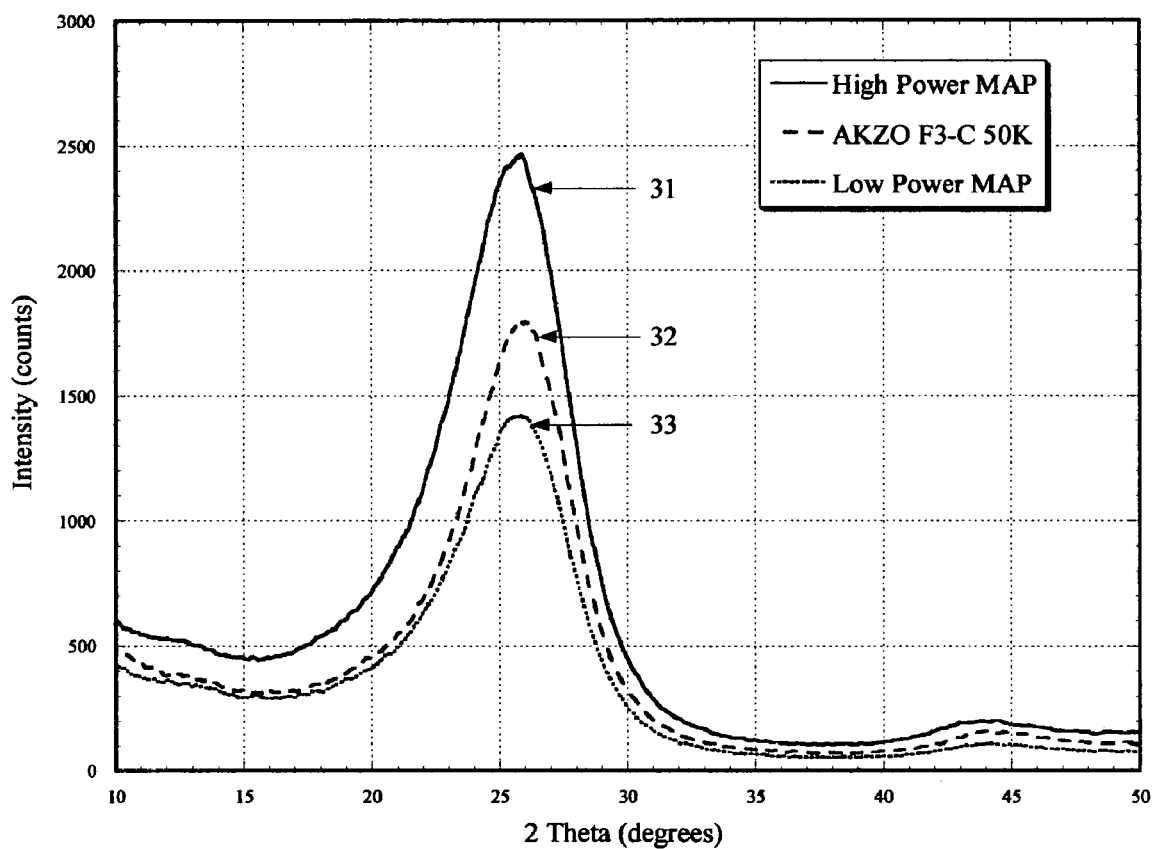
FIG. 3 presents X-ray diffractograms for several carbon fibers.

The inventive MAP method produced carbon fiber with equivalent morphological properties as conventional low-cost carbon fiber. Morphological evaluation was performed via Wide-Angle X-ray Diffractometry (WXRD). FIG. 3 shows WXRD comparisons between a high power MAP sample 31, a commercial low cost carbon fiber [AKZO F3(C) 50K tow] sample 32, and a low power MAP sample 33. This was accomplished very quickly in a length of just a few feet by changing the total microwave power level. The MAP system has a very low thermal mass which allows the processing parameters to be changed quickly compared to conventional ovens, which require hours before the effect of any process variable change is observed in the final product. FIG. 3 also shows the versatility of the MAP process, where fibers can be produced depending upon process variables with more or less graphite-like morphology, compared to corresponding low-cost conventional carbon fiber. This is clearly indicated in FIG. 3 where the conventionally produced carbon fiber morphology curve falls within the family of curves bounding the MAP process fibers.

Figure 4:
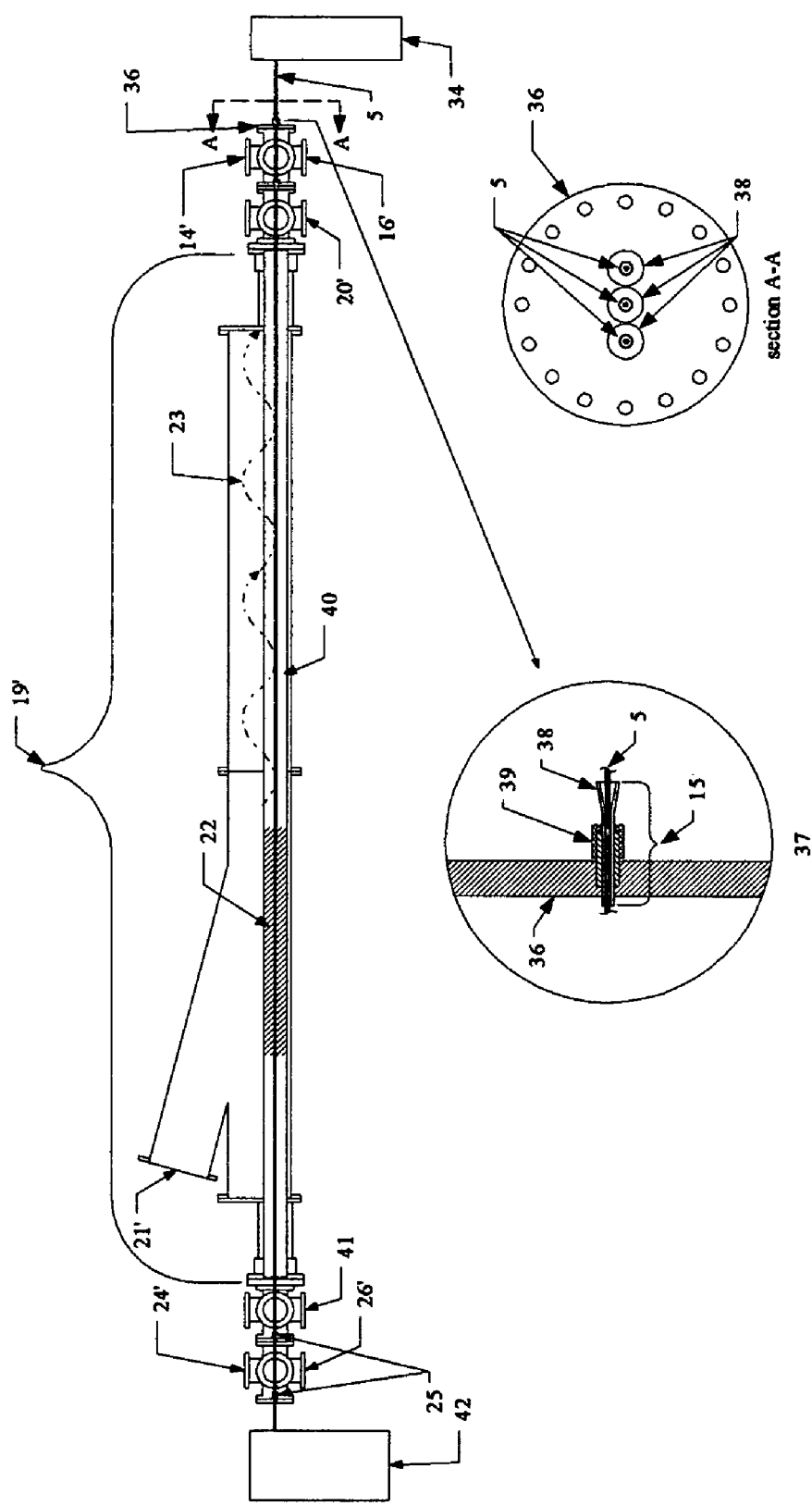
FIG. 4 is a schematic diagram of an embodiment of the present invention using a simple mitered waveguide feed.

The inventive system is easily expanded to accommodate multiple tows to be more representative of conventional industrial-scale multiple tow processing in a single production line. A multi-tow MAP system designed to process three tows is shown in FIG. 4 and described in the following example.

Example

Three tows of partially or fully oxidized PAN precursor 5 are fed by a commercial 3-tow tensioning unit 34 that controls the tension of each tow independently at three pounds during processing. The tows 5 are fed into three separate small ducts or eyelets 15 that enter flange 36 as shown in cross section A-A. The plane of the three tows 5 is perpendicular to the page as shown in cross section A-A. Input differential pumping chamber 14' is a large commercial 6-way stainless steel vacuum cross. An individual eyelet 15 is shown in detail 37. Each eyelet consists of a 4-mm ID, 8-mm OD, 75-mm long quartz tube with a flared funnel-shaped input section 38 that slowly compresses the tow 5 to the inside diameter of the eyelet 15. The diameter and length of eyelet 15 is sized to allow the tow to easily pass through the tube and yet is small enough to prevent significant air infiltration along the tow. Eyelet 15 is inserted into a commercial o-ring vacuum quick-connect feed-through 39 that is brazed or welded to vacuum flange 36. The tows pass through the first set of three eyelets into differential pumping chamber 14' consisting of a commercial six-way vacuum cross. The three tows exit input vacuum pumping chamber 14' into the MAP reactor 19' through an identical set of three eyelets 15.

The MAP reactor 19' consists of two WR 975 waveguide sections fed at the tow output by a section of WR 975 waveguide feed 21' mitered at an angle of approximately 15 degrees to the tow 5 axis with a long (~4 m) quartz tube 40 to contain the low pressure plasma. The quartz tube 40 is bonded to a metal bellows (not shown) at each end for protection of the quartz tube. A microwave glow discharge plasma 22 (preferably containing nitrogen) is formed and small amounts of microwave energy 23 serve to preheat the tow. Gas input or pumping for reactor 19' can be located at either pumping duct 20' or 41, depending upon the configuration desired. The vacuum isolation ducts 16' and 26' are connected to another pumping system (not shown). The carbonized and partially or fully-graphitized tow 9 exits the reactor through output vacuum pumping chamber 24' through eyelets 25 and is wound on the three-tow take-up winder 42.

Figure 5:
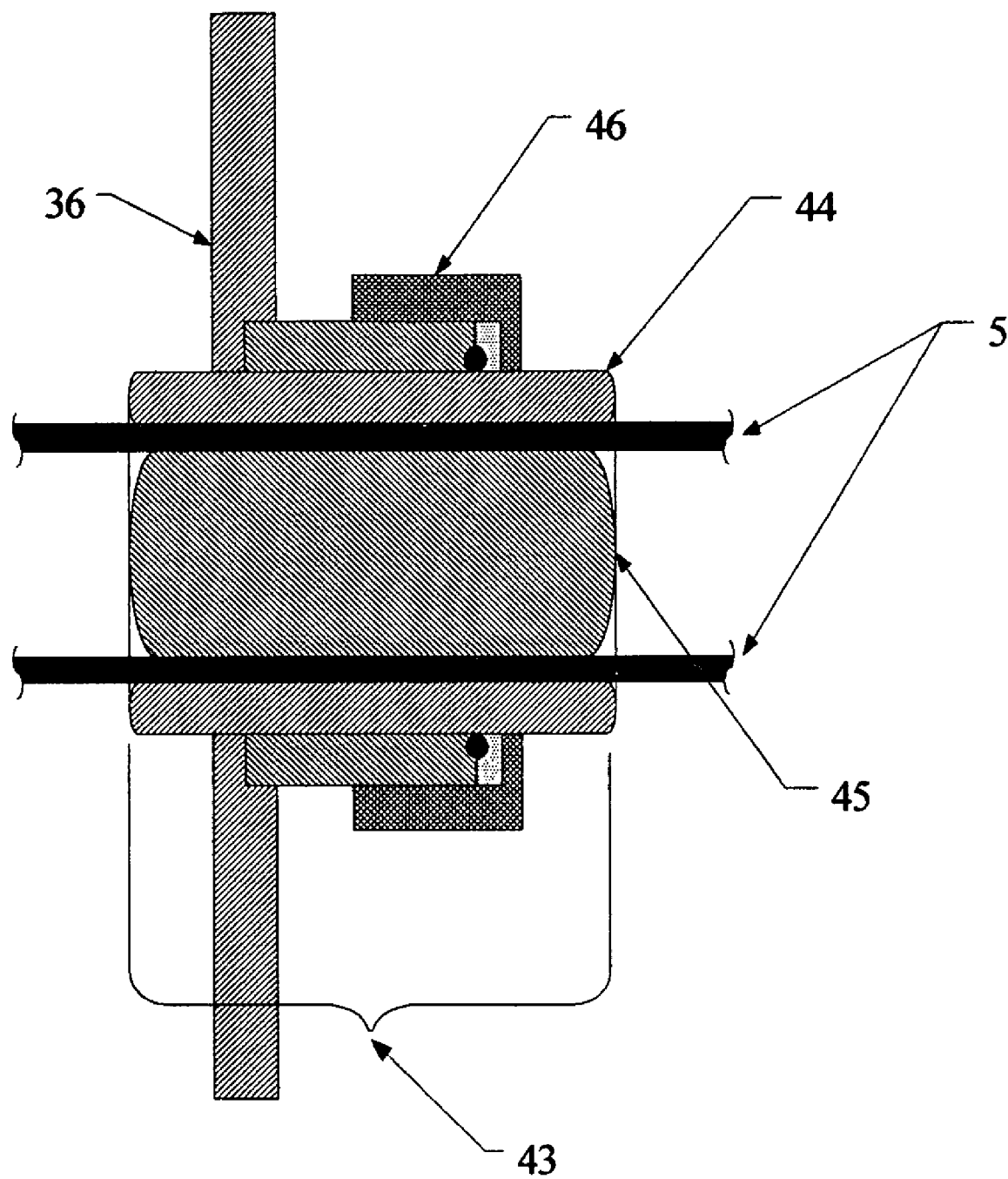
FIG. 5 is a schematic diagram of an embodiment of the present invention employing a coaxial eyelet.

The multi-tow MAP system in this example is fed by an input waveguide at an angle of 15 degrees to the tow axis. An oblique waveguide allows the microwave energy to be spread out over a longer tow length compared to MAP systems described in the first example. In operation the tows enter the 100-mm OD by 94-mm ID by 4-m long microwave-transparent chamber, as shown in FIG. 5. The microwave-transparent tube is mechanically isolated from the ends of the metal vacuum system by two stainless steel bellows fused to Kovar graded-glass transitions to the microwave-transparent tube. Once the correct line speed and tension for the tows have been set, the microwave power is slowly increased to break down the background gas (typically nitrogen) and create the microwave glow discharge plasma. The tows are initially exposed to ever increasing microwave/plasma power fluxes that break the chemical bonds in the complex organic molecules present in the tow filaments, thus enhancing the release of off gases or "effluent" as described in detail above. The effluent is further ionized by the plasma and is removed at either end of the system by high-speed roots pumps. The tows leave the microwave-transparent chamber at around 1000° C. but quickly cool as the tows enter the output plasma vacuum pumping system feeding another 700-cfm roots vacuum pump and mechanical roughing pump. The purpose of the input guard vacuum system is to remove most of the air that leaks through the eyelets because oxygen in the plasma discharge can rapidly erode the carbon fiber due the plasma-enhanced oxidation that converts the carbon in the tow to carbon monoxide and/or carbon dioxide. The tows then pass through the second set of eyelets into another six-way vacuum cross, which is connected to the input plasma vacuum pumping system. The cross is evacuated by a 700-cfm roots vacuum pump and a mechanical roughing pump to a desired base pressure (typically ~0.3 Torr). Process gas is leaked in at either end to produce a background pressure of 5-10 Torr. The background gas is then broken down by the microwave energy to form the processing plasma with very little oxygen contamination from the outside air. The plasma vacuum system provides a high-speed means of removing evolved tow gases during processing.

Another variation of the eyelet concept is shown in FIG. 5 and consists of a single large inside diameter eyelet 43 consisting of a large tube 44 and concentric tapered plug 45 along the axis of tube 44. The outside diameter of the plug 43 is less than the inside diameter of tube 44 so that an annular gap is formed between the eyelet and plug. Several tows 5 can be inserted simultaneously at different angles to the axis of the eyelet. The tows can be separated by several radial posts (not shown), which also serve to support plug 45 in the tube 44. The plug may or may not be movable axially to adjust the annular gap. The eyelet 43 may be constructed of low friction material or coated with low friction materials. A larger vacuum quick-connect feed-through 46 fastened to flange 36 is also shown.

Figure 6:
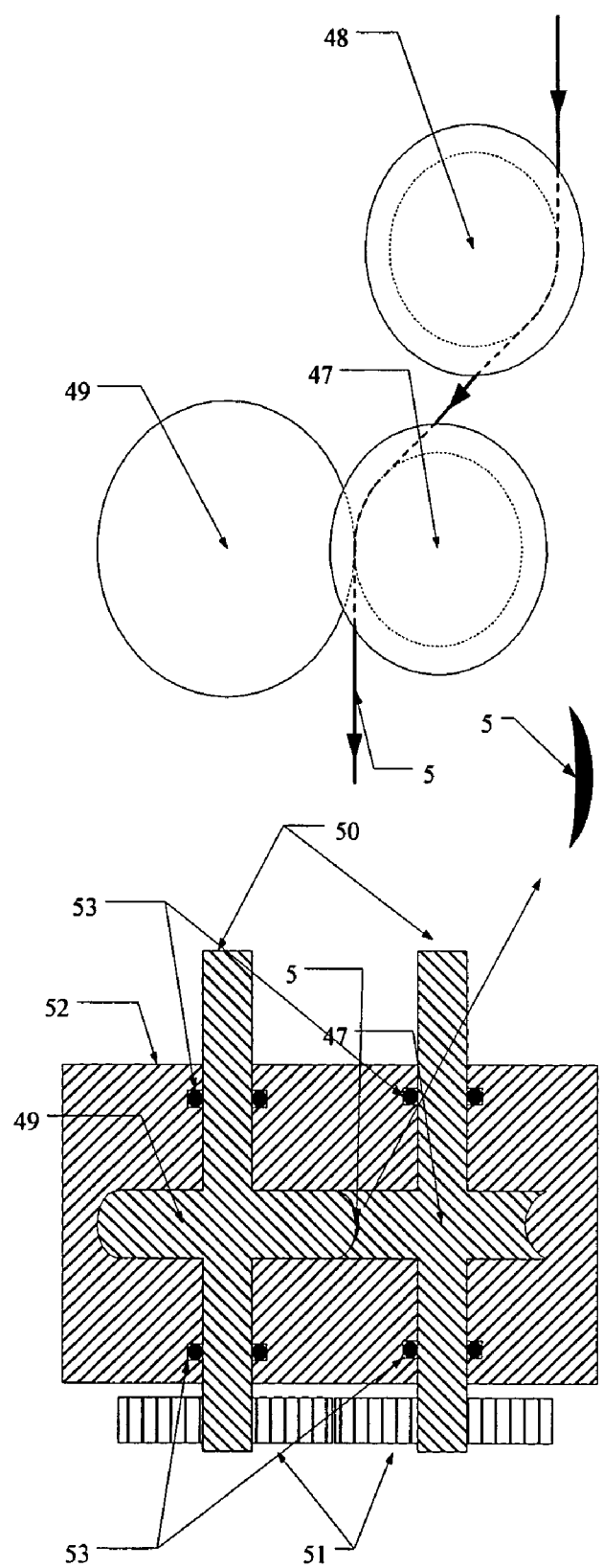
FIG. 6 is a schematic diagram of an embodiment of the present invention employing a sealable pulley to isolate the low pressure plasma from atmosphere while allowing the fiber tow to pass continuously; and, FIG. 7 is a schematic diagram of an embodiment of the present invention adapted to provide a longer process zone.

An alternate method for isolating the MAP reactor from atmosphere is a sealable pulley concept shown in FIG. 6. Metal pulley 47, which has a concave outer surface, serves to flatten and center tow 5 in the center of the trough by pushing the roller against tow 5 by means of external pulley 48. Pulley 49 has a convex outer surface with an outer surface that has less curvature than the concave surface of pulley 47. Therefore a generally crescent-shaped gap is formed between the pulleys, which is determined beforehand by the natural shape of the flattened tow 5 without pulley 49 touching pulley 47. Therefore when pulley 47 is gently pressed against pulley 49, both pulleys 47 and 49 and tow 5 form a good vacuum seal. Both pulley shafts 50 turn at the same rate using identical gears 51, and one pulley is driven while the other pulley follows. Close fitting housing 52 serves to provide a sufficient vacuum seal around both rollers and o-ring shaft seals 53 complete the sealing of the pulleys. Pulley 48 could be made from any metal compatible with vacuum and high temperatures such as molybdenum or titanium, or lower temperature metal alloys such as stainless steel coated with refractory ceramic coatings such as silicon carbide, alumina, or boron carbide. Although the sealable pulley concept is shown for a single tow, this concept can be easily extended to as many tows as desired by extending the pulley shaft so that many pulleys can be simultaneously driven and many tows can be sealed by using only three pulley shafts. The pulleys pairs 47 and 49 could be water-cooled if needed by using a pair of hollow shafts 50 cooled by a rotating water squirt tube.

Example

Figure 7:
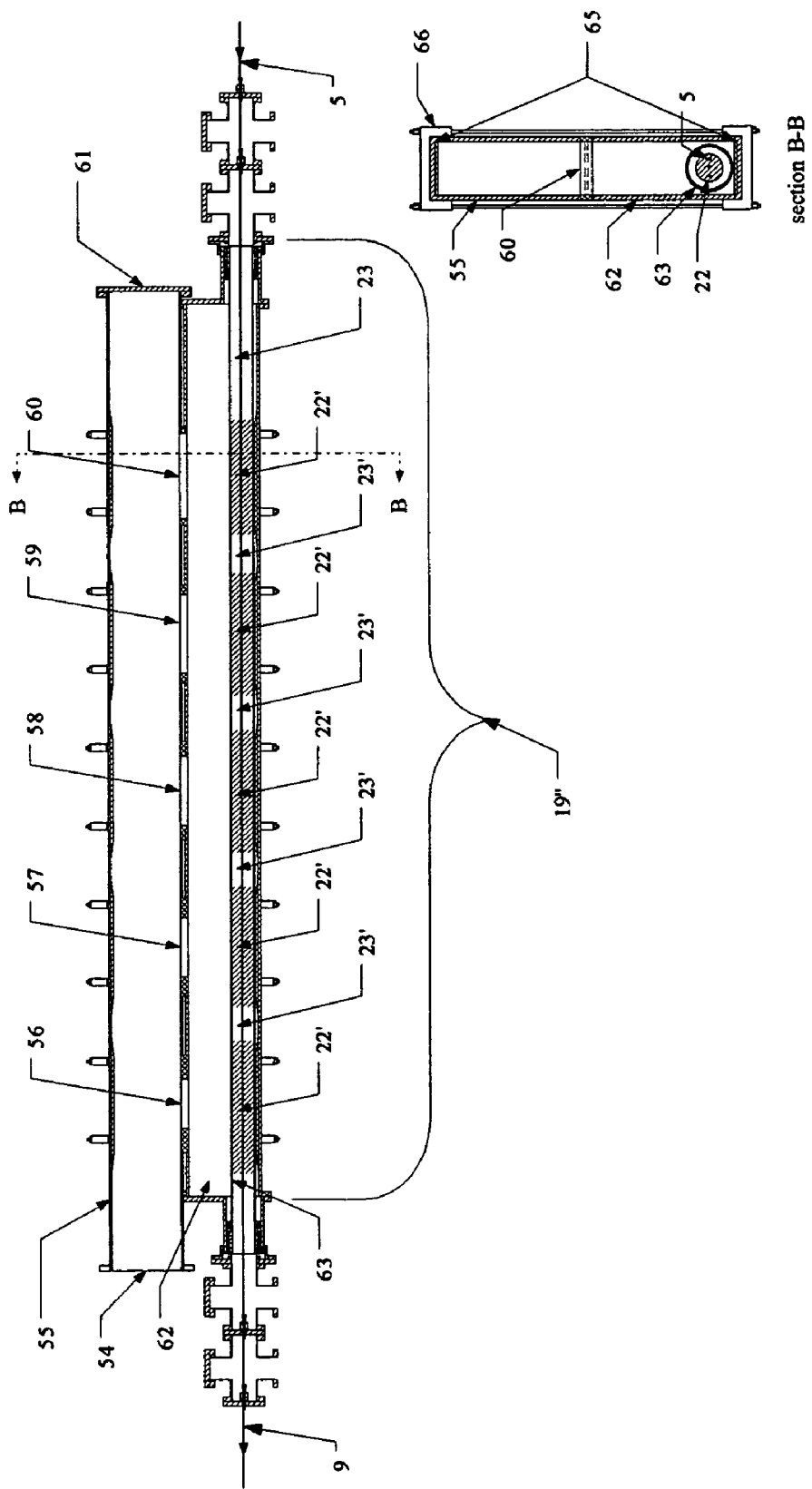

An alternate embodiment of the MAP system is shown in FIG. 7. Microwave energy enters feed 54 in upper waveguide 55, and the energy is coupled by a series of five metal plates with progressively larger openings 56-60. Any microwave energy not coupled through the five openings in the first pass is reflected back by reflecting plate 61 and most of this energy is coupled again through opening 60. The plates connect upper waveguide 55 with lower waveguide 62, which contains quartz tube 63. Inside quartz tube 63, plasma 22 surrounds three tows 5. The distribution of plate openings is adjusted to give equal amounts of plasma 22' under each opening. The plasma absorption of microwave energy is high so that between plasmas 22' are regions of low plasma density where direct microwave heating 23' of tows 5 occurs. A single opening is shown in cross section 64. Waveguide narrow wall shims 65 are disposed at each plate opening 56-60 to improve control of the microwave energy coupling through the plate openings 56-60. Upper waveguide 55, plates 56-60, and lower waveguide 62 are clamped together by a series of clamps 66 to contain the microwave energy. Plates 56 thru 60 preferably have identical outer dimensions so they can be interchanged one at a time when not in operation by loosening clamps 66 about the plate that needs to be changed and then tightening the same clamps 66. Plates 56 thru 60 are also termed coupling slots. The lower waveguide contains a 100-mm OD by 94-mm ID by 4-m long microwave-transparent tube that serves as a vacuum chamber containing the tows 5 and plasma 22'. The active extent of the MAP reactor is denoted by 19. The microwave-transparent quartz tube 63 is filled with a selected atmosphere (preferably less than about 50 Torr and more preferably about 1 to 20 Torr of nitrogen or some other oxygen-free or "inert" gas). The coupling slots serve to control the amount of microwave energy that is distributed along the microwave-transparent tube. As the microwave energy enters the upper waveguide from the left, a portion of this energy is coupled to the lower waveguide by the first coupling slot 56. The microwave energy breaks down the process gas to form a glow-discharge plasma around the tows. The absorption of the microwave energy by the plasma and tows is very strong and little energy is reflected back into the upper waveguide. The remaining energy in the upper waveguide propagates to the second slot 57 whereby a portion of this energy is again coupled to the lower waveguide. This process repeats itself until the remaining energy passes the last slot 60. Any remaining energy can be reflected back toward the last slot using a metal reflector plate or "short circuit" to boost the plasma power at the last coupling slot at the tow input.

For optimal carbon fiber processing, it is desirable to increase the tow heating as the tow moves from the input to the output of the MAP system. (In conventional furnaces, this temperature is near 250° C. at the input of the carbonization-processing stage to anywhere from 1300° C. to 2500° C. at the output of the graphitization stage.) This means that the generator feed is best placed on the output side of the tow where the available power is greatest. As depicted in FIGS. 1, 4, and 7 the tow travels from the input on the right to the output on the left whereas the microwave energy propagates in an opposite or counter-flow direction. It is also highly desirable to produce a plasma discharge over most of the length of the long applicator so that the residence time of the moving tow can be increased for the same line speed. Stated differently, for an optimum residence time, the highest tow speed is achieved with the longest plasma. The plasma absorption is very strong and the plasma extent is limited by recombination with the background gases, at these high pressures of from 1 to 10 Torr, therefore the plasma is usually restricted to the region under and immediately near the slots. The sizes of the slots may be adjusted empirically to produce a maximum plasma power at the output, and gradually deceasing plasma power going back toward the fiber input. This condition is usually satisfied by a slot size distribution that is smallest at the microwave generator input feed and gradually increases along the waveguide as less and less microwave energy is available for the slots because it has been reduced by the preceding slots. For added control on the tow input section of the applicator, another generator feed may replace the metal reflector plate 61, which would allow an independent control over the preheating of the tow. Both generators would still be sufficiently decoupled from one another due to the strong absorption by the plasma/tow combination.

It will be appreciated that for the fiber to be fully processed, a certain residence time is needed in the plasma. This will vary depending on such parameters as plasma density, type of fiber, etc. In any case, it can be seen that a longer plasma zone will enable a higher line speed for a given residence time. For this reason, the inventive apparatus uses an elongated process chamber and plasma fills a significant portion of the chamber's length. At the same time, one important aspect of the invention is the establishment of a gradient in microwave power in counterflow relation to the direction of travel of the fiber tow (i.e., with the lowest power near where the raw fiber enters the chamber and the highest power near where the processed fiber exits the chamber). As the microwave power decreases moving "upstream" in the process chamber it will, in some cases, fall below the level needed to maintain a plasma discharge in the particular processing atmosphere being used. In such cases there will be a volume of the chamber near where the fiber enters wherein the fiber does not initially contact a plasma but is subjected to some microwave energy as shown schematically at 23 in FIG. 2 for example.

Based on the foregoing discussion, although Applicants prefer a microwave power gradient in counterflow relationship to the linear movement of the fiber tow, the presence or absence of a plasma-free volume such as that shown at 23 in FIG. 2 is not regarded as critical to practicing Applicants' invention.

Those skilled in the art will also appreciate that the desired microwave power gradient along the length of the chamber may be a gradually decreasing power level such as that obtained from a mitered or oblique waveguide as shown generally in FIG. 4 or it may decrease in a stepwise manner in any selected number of steps. It will also be understood that although the microwave power is generally higher near where the fiber exits and generally lower near where the fiber enters, the power may not decrease precisely monotonically along the entire length of the chamber. In other words, small local fluctuations of plasma or power density might exist at various places in the chamber from time to time. Their effect on the fiber tow will normally be smoothed by the continuous travel of the fiber tow so that overall the tow experiences a generally increasing application of energy as it moves through the chamber from entry point to exit point.

It will be further appreciated that the process chamber is generally elongated parallel to the fiber tow. This geometry minimizes wasted power by concentrating the plasma in a small volume close to the tow and also makes it easier to establish a power gradient along the length. The chamber is preferably at least four times as long as it is wide, and more preferably the length is at least ten times the maximum cross sectional dimension.

Occasionally the MAP system may be run with excess oxygen due to air leakage through the eyelets where the MAP system opens to atmosphere. Although large amounts of excess oxygen can cause the carbon fiber tow to break because of severe oxidation, a small amount of excess oxygen has the added benefit of adding oxygen groups the surface of the carbon fiber. This kind of in situ surface treatment is often done at the end of the carbonization/graphitization stage. It occurs at the high temperature end because of hot oxygen gas activating the surface. With suitable control at the MAP end a small quantity of air can be intentionally introduced into the plasma process end of the MAP. The combined effect of high temperature and plasma ionization creates atomic oxygen, oxygen ions, and free radicals, which act on the surface of the carbon fiber providing for in situ surface treatment of the carbon fibers.

Example

X-Ray Photoelectron Spectroscopy (XPS) analysis of carbon fiber produced in the MAP system with a small air leakage demonstrated a concentration of surface oxygen equal or higher than the corresponding values present on a conventionally-produced carbon fiber with standard industrial ozone surface treatment. XPS analysis was performed with a large aperture 0.8 mm and a minimum of 25 sweeps for each data point. Table 3 shows that the MAP processed fibers with a small amount of oxygen has higher amounts of elementary oxygen on the surface of the fibers compared to conventional carbon fibers.

TABLE 3

Surface oxygen content on fibers

| Fiber Samples | Measured Positions | Average (%) | Standard Deviation (%) |
|---|---|---|---|
| MAP 1 | 11 | 8.0 | 1.9 |
| MAP 2 | 5 | 7.5 | 1.8 |
| MAP 3 | 5 | 7.1 | 2.5 |
| MAP 4 | 5 | 9.2 | 2.1 |
| Untreated Conventional | | 2-4 | |
| Ozone-Treated Conventional | | 4.7-5.8 | |

This surprising effect of the basic MAP system creates added benefits because this system can process fibers from a state of fully-oxidized precursor all the way to surface-treated carbon fiber. This clearly demonstrates proof-of-principal of in situ MAP surface treatment which conventional carbon fiber manufacturing processes cannot achieve. Those skilled in the art will appreciate that a surface treatment as described in the preceding example may be configured to incorporate the surface treatment with the MAP plasma section. Alternatively, for a more controllable surface treatment system a separate reactor may be placed immediately after the MAP carbonization/graphitization system to have independent control over the surface treatment, i.e., independent of the main MAP system. In summary, the MAP process simplifies carbon fiber production by replacing the carbonization, graphitization and surface treatment processing steps with a single MAP processing step. Another major benefit is that the off-gases produced during the carbonization process supplement the plasma reaction and drive carbonization, thus reducing the amount of volatile gases in the effluent gas stream, which must be purified prior to venting, so that less incineration is required.

A well controlled, moderate amount of surface roughening, via plasma etching or ablation of the filament surface is beneficial for the bonding of the carbon fiber to the resin matrix in a composite structure. An examination of the MAP fiber under Scanning Electronic Microscopy (SEM) shows a very low level of surface erosion. This effect is beneficial for the intended application for the MAP fibers.

In many of the examples it is contemplated that the inventive process will be operated at a chamber pressure generally less than atmospheric. The partial vacuum is maintained in the chamber by pumping and assisted by end fittings that minimize in-leakage of air. It will be appreciated that in some circumstances, a gas mixture and microwave power level may be selected that would allow the process to operate slightly above atmospheric pressure. In that case, in-leakage at the ends of the chamber would not be a problem and, in fact, out-leakage may then be used to carry certain effluents out of the process environment.

It will be understood that many microwave sources are commercially available, and they may operate at various frequencies. From an economic or regulatory standpoint, some frequencies are preferable (for example industrial heating systems frequently operate on the ISM bands around 915 MHz and 2450 MHz) but the skilled artisan can easily adapt the present invention to other desired operating frequencies through routine experimentation and engineering.

We claim:

1. An apparatus for continuously processing at least one carbon fiber tow comprising:
   a chamber adapted to maintain a selected atmosphere, said chamber having a first end with a first opening to allow said at least one carbon fiber tow to enter said chamber and a second end with a second opening to allow said at least one carbon fiber tow to exit said chamber, said first and second openings adapted to limit incidental gas flow into or out of said chamber;
   a system comprising at least one of pumps or ducts to supply process gas into said chamber; and
   a waveguide generator present at only the second end of the chamber, wherein the waveguide generator is the sole waveguide generator of said apparatus, wherein the wave guide generator provides a source of microwave power configured to provide a microwave power gradient within said chamber, wherein said microwave power gradient provides a plasma from the process gas at the second end of the chamber, and wherein the plasma is not present at the first end of the chamber and the microwave power gradient heats the at least one carbon fiber tow at where the plasma is not present.

2. An apparatus in accordance with claim 1 wherein said chamber comprises a generally cylindrical tube of microwave transparent material disposed within a metal enclosure.

3. An apparatus in accordance with claim 1 wherein each of said first and second openings comprises two eyelets separated by a differential pumping chamber.

4. An apparatus in accordance with claim 1 wherein each of said first and second openings comprises a pair of rollers in mating arrangement, at least one of said rollers having at least one circumferential groove adapted to contain said at least one carbon fiber tow as said at least one carbon fiber tow passes between said rollers.

5. An apparatus in accordance with claim 1 wherein said process gas comprises at least one gas selected from the group consisting of: nitrogen, hydrogen, helium, neon, and argon.

6. An apparatus in accordance with claim 5 wherein said process gas further comprises oxygen, whereby said at least one carbon fiber tow is subjected to oxidative surface treatment.

7. An apparatus in accordance with claim 1 wherein said selected atmosphere has a pressure less than about 50 Torr.

8. An apparatus in accordance with claim 1 wherein said at least one carbon fiber tow is derived from a precursor material selected from the group consisting of: rayon fibers, cellulose fibers, lignin, and lignin-base/blended precursors; polyalkenes and polyolefins through PVC, including exotic rigid rod polymers; polyethylene, polypropylene, polybutadiene; polyesters; polyethylene terephthalates (PET); polybutylene terephthalates (PBT); petroleum pitch and coal pitch; commodity grade, carpet-grade, and chemically-modified carpet-grade PAN; chemically modified and pretreated thermoplastics; and, chemically modified and chemically compounded precursors.

9. The apparatus of claim 1 wherein the at least one carbon fiber tow comprises a thermoplastic precursor.

10. The apparatus of claim 9 wherein the microwave power gradient at the first end of the chamber provides a carbonization region.

11. The apparatus of claim 9 wherein the plasma at the second end of the chamber provides a graphitization region.

12. The apparatus of claim 11, wherein the plasma shields the at least one carbon fiber tow from being directly heated from the microwave power gradient, wherein energy from the microwave power gradient is transferred to at least plasma electrons of the plasma to provide plasma species, in which the plasma species reacts with the at least one carbon fiber tow to provide desorption of oxygen, nitrogen, hydrogen, or a combination thereof from the at least one fiber tow.

13. The apparatus of claim 9, wherein the thermoplastic precursor is at least partially oxidized.

14. The apparatus of claim 1 wherein the plasma is a non-oxidizing glow discharge plasma.

* * * * *